(12) United States Patent
Choe et al.

(10) Patent No.: US 7,005,687 B2
(45) Date of Patent: Feb. 28, 2006

(54) PHOTODETECTOR

(75) Inventors: Joong Seon Choe, Seoul (KR); Yong Hwan Kwon, Daejon-shi (KR)

(73) Assignee: Electronics and Telecommunications Research Institute, (KR)

( * ) Notice: Subject to any disclaimer, the term of this patent is extended or adjusted under 35 U.S.C. 154(b) by 184 days.

(21) Appl. No.: 10/682,549

(22) Filed: Oct. 8, 2003

(65) Prior Publication Data
US 2004/0118992 A1 Jun. 24, 2004

(30) Foreign Application Priority Data
Dec. 24, 2002 (KR) .................. 10-2002-0083757
Mar. 15, 2003 (KR) .................. 10-2003-0016276

(51) Int. Cl.
*H01L 29/72* (2006.01)
(52) U.S. Cl. .................. 257/189; 257/9; 257/431; 257/442; 257/458; 257/461
(58) Field of Classification Search .............. 257/9, 257/431, 442, 458, 461, 189
See application file for complete search history.

(56) References Cited

U.S. PATENT DOCUMENTS 6,278,820 B1   8/2001   Hayes
6,633,425 B1   10/2003  Lee
2004/0126057 A1 * 7/2004 Yoo .................. 257/9

FOREIGN PATENT DOCUMENTS

JP   08-062554     3/1996
KR   2001-0090166  10/2001

OTHER PUBLICATIONS

Andreas Stohr, et al.; "Optical Heterodyne Millimeter-Wave Generation Using 1.55-μm Traveling-Wave Photodetectors"; IEEE Transactions on Microwave Theory and Techniques, vol. 49, No. 10, Oct. 2001.

* cited by examiner

*Primary Examiner*—Edward Wojciechowicz
(74) *Attorney, Agent, or Firm*—Blakely, Sokoloff, Taylor & Zafman

(57) ABSTRACT

The present invention provides the photodetector comprising a lower cladding layer including a n-type doped region, an absorbing layer, an upper cladding layer including a p-type doped region, and ohmic electrodes connected to said lower cladding layer and said upper cladding layer, wherein said p-type doped region extends to be formed into said absorbing layer by a predetermined length.

In accordance with present invention, by reducing effect of the hetero junction barrier where holes move in the intrinsic region, the operating voltage can be decreased and the bandwidth can be improved.

4 Claims, 5 Drawing Sheets

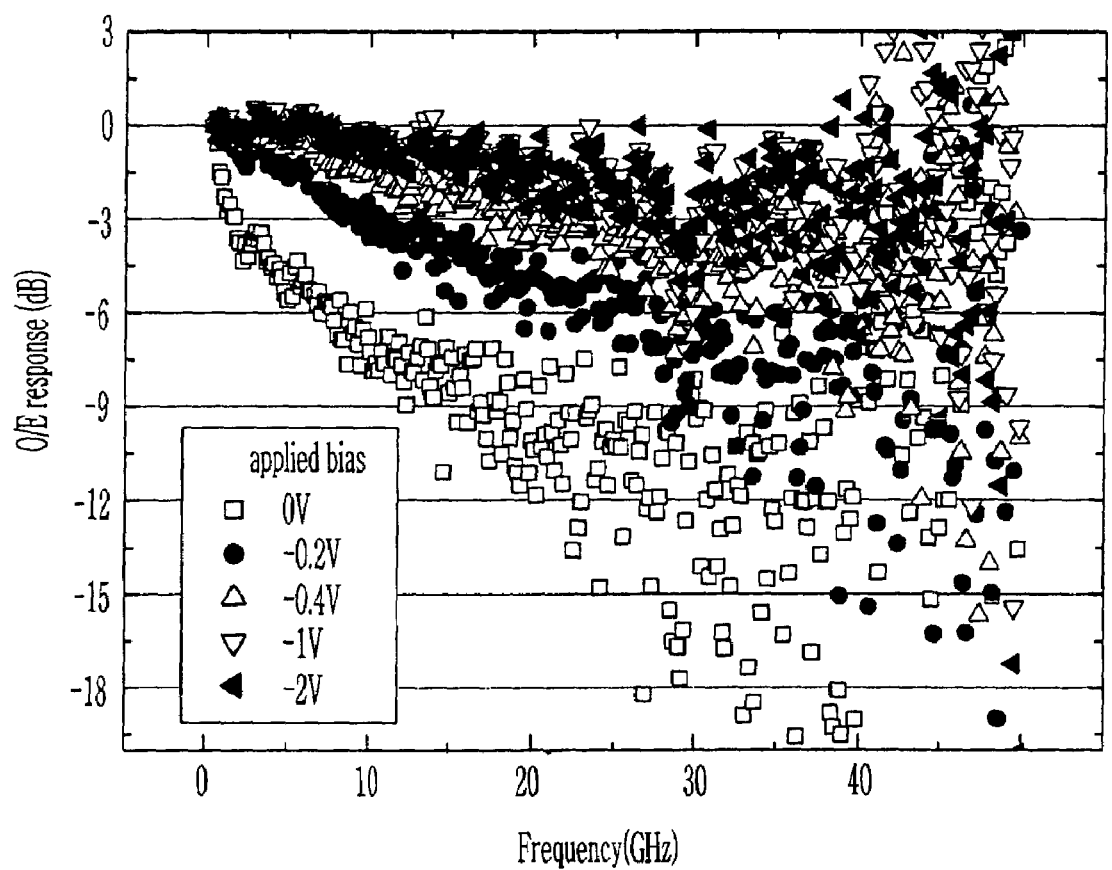

PHOTODETECTOR

BACKGROUND OF THE INVENTION

1. Field of the Invention

The present invention relates to a photodetector, in particular, to the photodetector with high power operation and large bandwidth in optical communication system.

2. Description of the Prior Art

As an information technology has been developed, an amount of information, which transmits through optical fibers, has been significantly increased. According to this trend, the photodetector requires a large bandwidth to receive a large amount of information and a high power operation.

When quantum wells are utilized in the photodetector, cladding layers having relatively small refractive index are stacked at both sides thereto for optical confinement. Thus, materials of large band gap are used for the cladding layer. InGaAsP material is generally used on a InP substrate in a device operable in wavelength band of 1.55 $\mu$m,.

However, energy band structure has a tendency of a discontinuity due to a difficulty of crystalline growth, and excited charges are subject to passing some barriers, so that it results in an increment of operating voltage and decrement of bandwidth.

SUMMARY OF THE INVENTION

Therefore, to solve the above problem, it is an object of the present invention is to provide a photodetector capable of removing an influence on the bandwidth and operating voltage caused by heterojunction.

To achieve the above object, one aspect of the present invention provides a photodetector having a heterojunction structure in an intrinsic region, comprising a lower cladding layer including an n-type doped region, an absorbing layer, an upper cladding layer including a p-type doped region and ohmic electrodes connected to said lower cladding layer and said upper cladding layer, respectively, wherein said p-type doped region extends into said absorbing layer by a predetermined length.

The photodetector to which the present invention is applied is one that has a heterojunction structure in an intrinsic region, and is not limited to specific kind, and for example, the photodetector is preferably one of a waveguide type PIN structure photodetector, a travelling wave photodetector, or an avalanche photodetector.

Preferably, a distance between said n-type doped region and said p-type doped region can be 0.6 to 1.2 $\mu$m, and when absorbing layer has a structure that a quantum well barrier and a quantum well layer are alternatively formed, the p-type doped region can extend to be formed to some portion of the quantum well barrier.

Hereinafter, embodiments of the present invention will be explained with reference to the accompanying drawings to provide those who are skilled in the art with detailed explanations of the present invention.

BRIEF DESCRIPTION OF THE DRAWINGS

FIGS. 5A and 5B show graphs for measuring driving voltages of the photodetector of the present invention and of the prior art, respectively.

DESCRIPTION OF THE PREFERRED EMBODIMENTS

Figure 1:
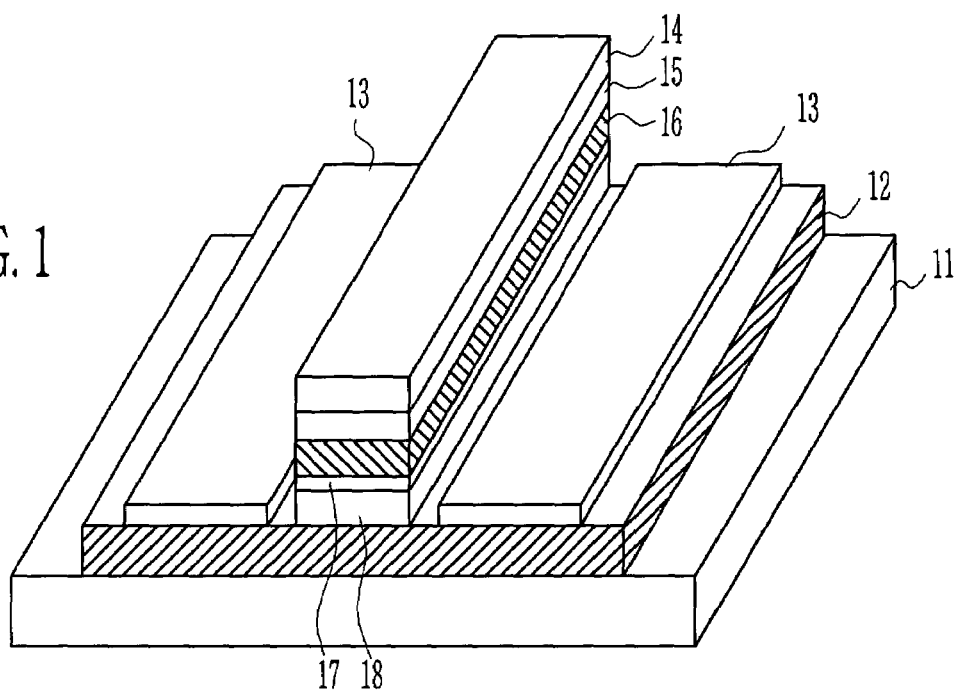
FIG. 1 shows a schematic configuration of the optical waveguide type photodetector having a PIN structure in accordance with one embodiment of the present invention.

FIG. 1 shows a schematic configuration of the optical waveguide type photodetector having a PIN structure in accordance with one embodiment of the present invention.

A non-conductive InP substrate 11 having a low loss of microwave can be used for high-speed operation, and n+ InP layers 12, 18 are grown on the substrate 11. And then a cladding layer 17, an absorbing layer 16 and a cladding layer 15 are consequently formed thereon. They are etched in ridge shape for the lateral optical confinement, n+ ohmic electrodes 13 are formed on both sides of the surface of the exposed n+ InP layer 12 and used as a ground line, and a p+ ohmic electrode 14 is formed on the p+ cladding layer 15 and used as a signal wiring. N+ ohmic electrode 13 and p+ ohmic electrode 14 constitute a coplanar waveguide and functions as propagating microwave safely.

Those n+ InP layers 12, 18 can be grown with doping concentration of more than about $10^{18}/cm^3$, and the cladding layer 17 can be grown with the InP material and has a highly doped n+ region. The cladding layer 15 may be grown with doping concentration of about $10^{18}/cm^3$. Meanwhile, the absorbing layer 16 may have a structure such as quantum well, multi quantum well or bulk type. For example, in quantum well structure, the absorbing layer 16 may have a lower quantum well barrier of InGaAsP with a thickness of about 2000 Å, a quantum well of InGaAs with a thickness of about 2000 Å, and an upper quantum well barrier of InGaAsP with a thickness of about 2000 Å.

In this case, a starting position of p-type doping region is within the upper quantum well barrier of InGaAsP, in accordance with the preferred embodiment of the present invention. In other words, the doping region for the cladding layer 15 extends into the quantum well barrier of InGaAsP. For example, it may extend into about 1000 Å. On the contrary, n-type doped region does not extend into the cladding layer 17. This will be explained later in detail.

The most important factor in high-speed operation of the PIN photodetector is electrostatic capacitance of the photodetector. Especially, the amount of the electrostatic capacitance is determined depending on the area of the photodetector and thickness of intrinsic region thereof in the optical waveguide type PIN photodetector.

The thickness of the intrinsic region is changed in accordance with the position of the doped region. The thicker the intrinsic region is, the smaller the electrostatic capacitance is, and it causes a limitation in bandwidth. Thus, in case the intrinsic region is significantly thick, the limitation in bandwidth is decreased, so that it is preferable that the intrinsic region has a thickness of not more than about 6000 Å.

However, by adjusting the regions of cladding layers 15, 17 and the position in which the p-type doping is started, barrier effect may be reduced. Therefore, holes can pass through the barrier under a low voltage of reverse bias. It is possible to implement the intrinsic region having more than 6000 Å. In other words, the intrinsic region may be formed with 0.6~1.2 $\mu$m in length. Hereinafter, the operation principle will be described in detail with reference to FIGS. 2, 3, and 4.

Figure 2:
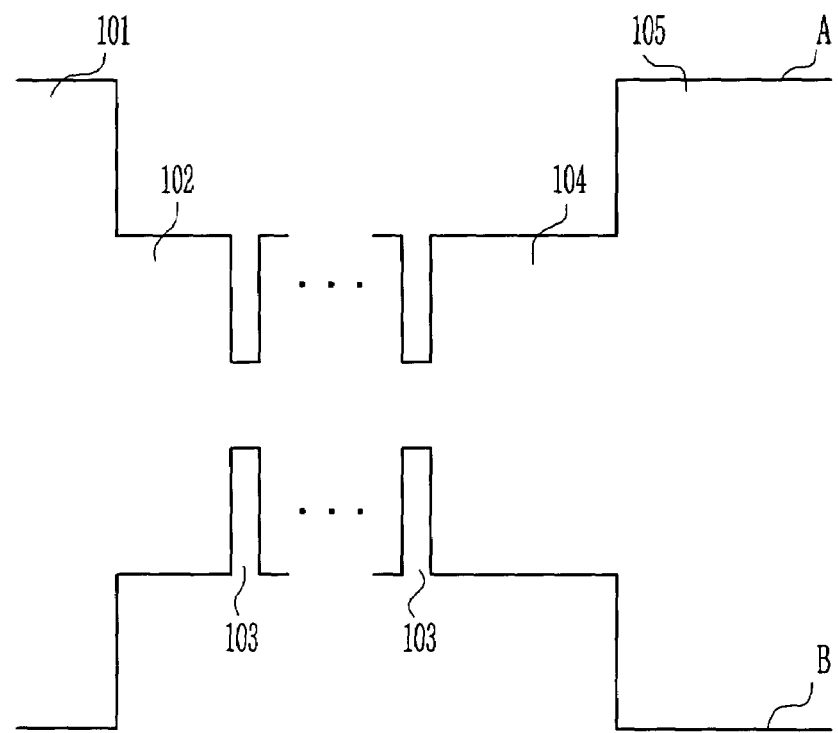
FIG. 2 shows a band diagram for the PIN photodetector having a quantum well absorbing layer without performing any doping process.
Figure 3:
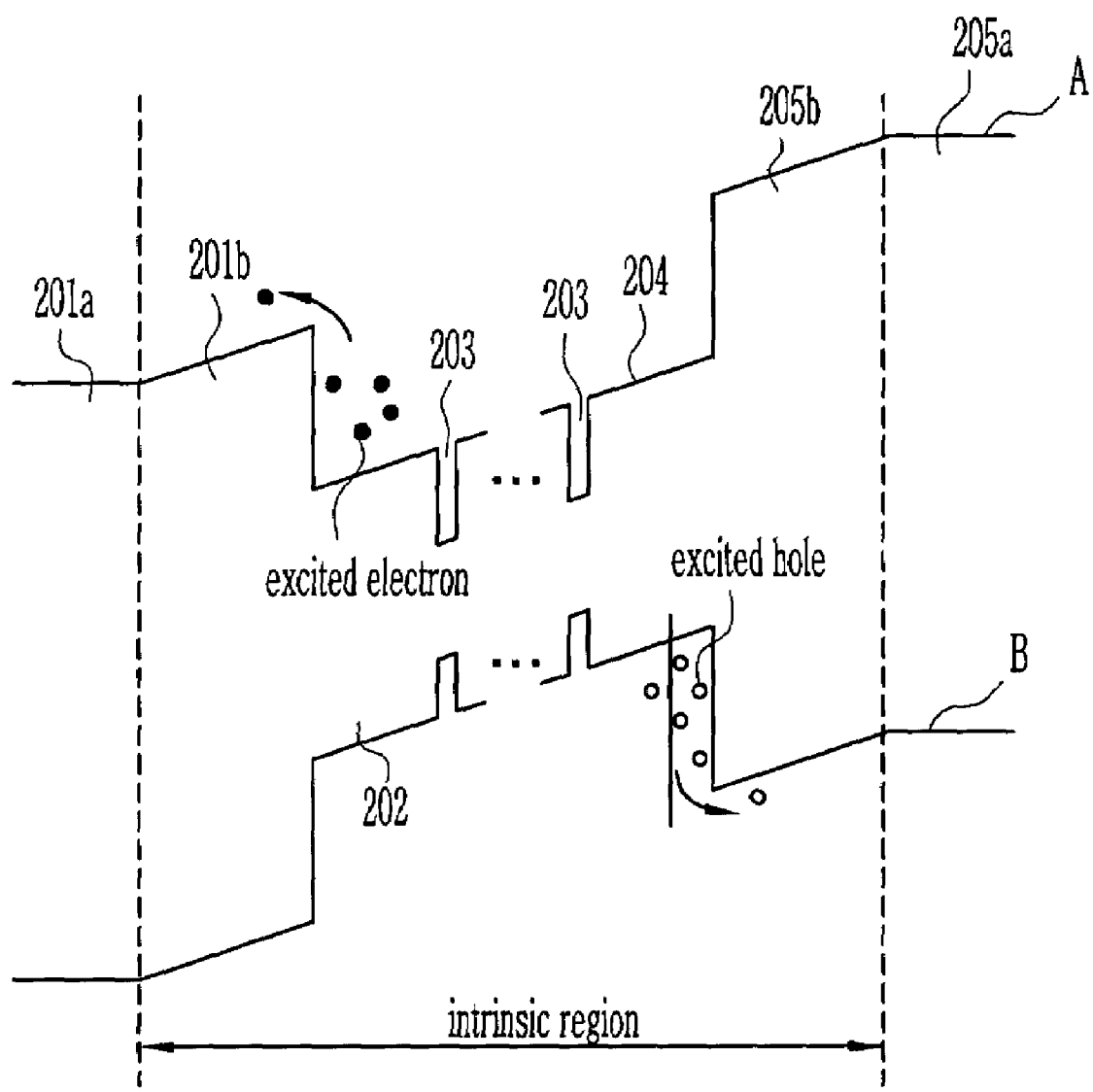
FIG. 3 shows a band diagram for the PIN photodetector having a quantum well absorbing layer when performing doping process of the prior art.
Figure 4:
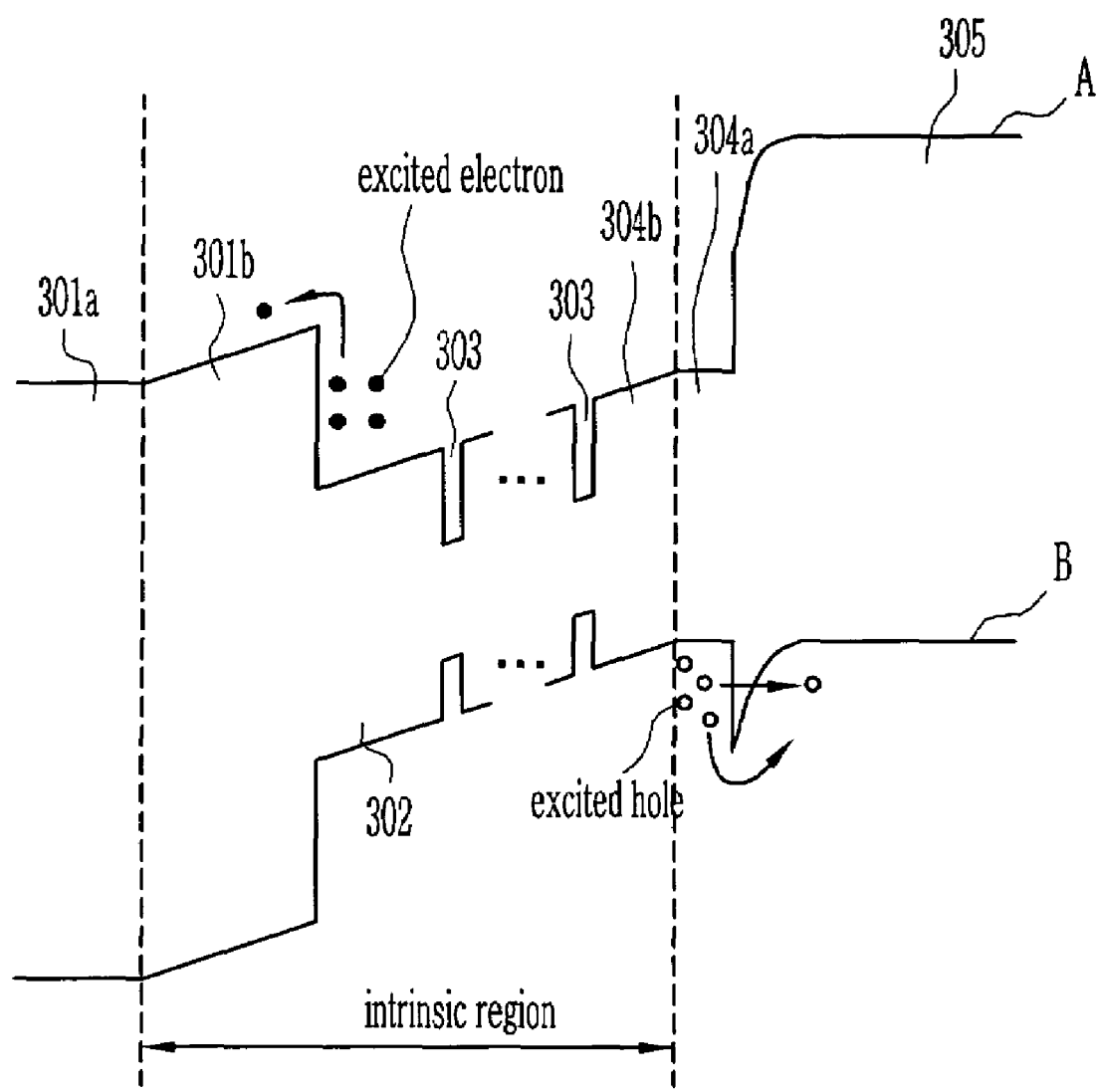
FIG. 4 shows a band diagram for the PIN photodetector having a quantum well absorbing layer when performing doping process in accordance with one embodiment of the present invention.

In the PIN photodetector having the quantum well absorbing layer, FIG. 2 shows a band diagram for the PIN photodetector having the quantum well absorbing layer without doping process, FIG. 3 shows a band diagram for the PIN photodetector having the quantum well absorbing layer through doping process of the prior art, and FIG. 4 shows a band diagram for the PIN photodetector having the quantum well absorbing layer through doping process in accordance with one embodiment of the present invention.

Referring to FIG. 2, A represents a conduction band, B represents a balance band, and numerical references 101 and 105 show n+ and p+ cladding layers, respectively. When the quantum well is used as the absorbing layer, cladding layers 101,105 are used for optical confinement in the waveguide type photodetector. In this case, a material having small index of refraction is used for the cladding layer and has a resultant large band gap. Numerical references 102 and 104 show upper and lower barriers of the quantum well, respectively.

A band diagram when the doping process is performed in accordance with the prior art will be described with reference to FIG. 3. In the prior art, some portions (201b, 205b) of two cladding layers (201a, 201b, 205a, 205b) are included in the intrinsic region.

Therefore, electrons and holes move toward the doped region due to reverse voltage applied to the photodetector and reach junction region between cladding layers 201b, 205b and barriers 202, 204 of the quantum well 203. Thus, for those electrons and holes to move to the doped region, those electrons and holes should jump the potential barriers by thermal energy. It increases the operating voltage and reduces the bandwidth.

On the contrary, FIG. 4 shows a band diagram for the PIN photodetector having a quantum well absorbing layer through doping process in accordance with one embodiment of the present invention, wherein the reverse voltage is applied to the photodetector. A numerical reference 303 represents the quantum well layer, 301a and 305 show the doped lower cladding layer and the doped upper cladding layer, respectively, and 302 and 304 show lower and upper quantum well barriers, respectively. The difference between FIG. 4 and FIG. 3 is that p+ doped region extends into the barrier of the upper quantum well, which is divided into the doped region (304a) and the undoped region (304b) in FIG. 4.

In this case, holes and electrons are generated from the quantum well layer 303 and move toward p-layer and n-layer, respectively. However, electrons are not easily induced to the doped region due to the energy barrier, which is generated at the interface between the lower quantum well barrier 302 and undoped cladding layer 301b. The holes reach the doped layer 304a before the interface between the cladding layer 305 and upper quantum well barrier 304. For these reasons, holes can pass through barrier through tunneling or jumping a thin energy barrier so that moving speed of holes is significantly not reduced by barrier.

Both electrons and holes reach the doped region, before reaching the cladding layer, due to a limitation of electrostatic capacitance. It can be applied for holes having a large effective mass and low moving speed. In other words, because electrons have small effective mass, the barrier effect is not dominant.

Since the electrostatic capacitance is inverse proportional to the thickness of the intrinsic region, the electrostatic capacitance of not more than a predetermined value can be maintained.

(Comparative Example)

Hereinafter, a comparative result of the photodetector of the prior art and that of the present embodiment will be described.

First, the PIN photodetector consists of the InP cladding layer, and the lower quantum well barrier InGaAsP with about 2000 Å, the quantum well InGaAs layer with about 2000 Å, and the upper quantum well barrier InGaAsP layer with about 2000 Å as the absorbing layer on the non-conductive InP substrate, and p+ doped cladding layer with about $10^{18}/cm^3$ is formed thereon.

The n+ region having doping concentration of more than $10^{18}/cm^3$ and the p+ region having doping concentration of more than $10^{18}/cm^3$ are positioned within the n cladding layer and p cladding layer, respectively, in accordance with the photodetector of the prior art, however, the p+ region extends into the absorbing layer by a predetermined length (e.g. 1000 Å) in accordance with the present embodiment. This difference can be readily acknowledged by comparing FIG. 3 and FIG. 4.

Figure 5B:
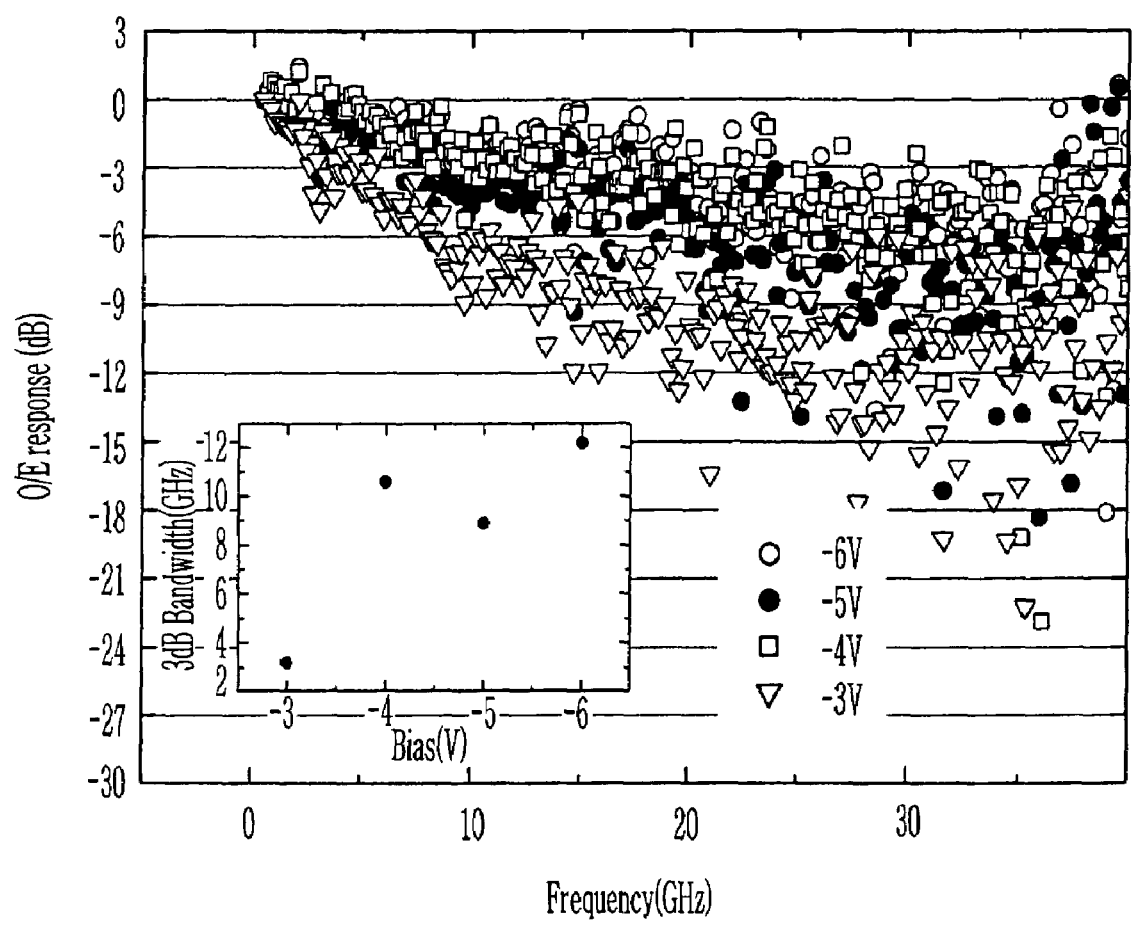

FIGS. 5A and 5B show graphs for measuring applied voltages of the photodetector of the present invention and of the prior art, respectively. The present embodiment shows the characteristic that O/E reaction (optical/electric reaction) is saturated at the reverse voltage of −2V, however, the O/E reaction is saturated at more than the reverse voltage of −4V in the prior art. In other words, these results represent that the applied voltage to the photodetector is decreased.

Although the present invention has been described in conjunction with the preferred embodiment, the present invention is not limited to the embodiments, and it will be apparent to those skilled in the art that the present invention can be modified in variation within the scope of the invention.

As described above, the photodetector of the present invention uses quantum well as absorbing layer to achieve a high output current. Small junction capacitance is provided by thick intrinsic region, and the reduced effect of energy barrier along the path of holes suppresses the reduction of bandwidth and increase in operating voltage. Therefore, this invention can be applied to high output power-wide bandwidth photodetector.

What is claimed is:

1. A photodetector having a heterojunction structure in an intrinsic region, comprising:
    a lower cladding layer including an n-type doped region;
    an upper cladding layer including a p-type doped region;
    an absorbing layer located between the lower cladding layer and the upper cladding layer; and
    ohmic electrodes connected to said lower cladding layer and said upper cladding layer, respectively
    wherein said p-type doped region extends into said absorbing layer by a predetermined length and the intrinsic region is defined by an area between the n-type doped region and the p-type doped region.
2. The photodetector as claimed in claim 1,
    wherein a distance between said n-type doped region and said p-type doped region is 0.6 to 1.2 µm.
3. The photodetector as claimed in claim 1,
    wherein said absorbing layer has a structure that a quantum well barrier and a quantum well layer are alternatively formed, and
    said p-type doped region extends into some portion of said quantum well barrier.
4. The photodetector as claimed in claim 1,
    wherein said the photodetector is one of a waveguide type PIN structure photodetector, a travelling wave photodetector, or an avalanche photodetector.

* * * * *